US009797946B2

(12) United States Patent
Alvarez-Icaza Rivera et al.

(10) Patent No.: US 9,797,946 B2
(45) Date of Patent: Oct. 24, 2017

(54) INITIALIZING AND TESTING INTEGRATED CIRCUITS WITH SELECTABLE SCAN CHAINS WITH EXCLUSIVE-OR OUTPUTS

(71) Applicant: INTERNATIONAL BUSINESS MACHINES CORPORATION, Armonk, NY (US)

(72) Inventors: Rodrigo Alvarez-Icaza Rivera, San Jose, CA (US); John V. Arthur, Mountain View, CA (US); Andrew S. Cassidy, San Jose, CA (US); Bryan L. Jackson, Fremont, CA (US); Paul A. Merolla, Palo Alto, CA (US); Dharmendra S. Modha, San Jose, CA (US); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 14/946,543

(22) Filed: Nov. 19, 2015

(65) Prior Publication Data
US 2017/0199241 A1    Jul. 13, 2017

Related U.S. Application Data

(63) Continuation of application No. 14/229,739, filed on Mar. 28, 2014, now Pat. No. 9,244,124.

(51) Int. Cl.
*G01R 31/28*    (2006.01)
*G01R 31/317*    (2006.01)
*G01R 31/3177*    (2006.01)

(52) U.S. Cl.
CPC ... *G01R 31/31703* (2013.01); *G01R 31/3172* (2013.01); *G01R 31/3177* (2013.01); *G01R 31/31725* (2013.01)

(58) Field of Classification Search
CPC ........ G01R 31/3177; G01R 31/318516; G01R 31/318519; G01R 31/318558; G01R 31/318561
See application file for complete search history.

(56) References Cited

U.S. PATENT DOCUMENTS 5,130,575 A    7/1992    Montoye
5,533,139 A    7/1996    Parker
(Continued)

OTHER PUBLICATIONS

Rajski, J. et al., "Test Data Decompression for Multiple Scan Designs with Boundary Scan", Proceedings of the 1998 IEEE Transactions on Computers, Nov. 1998, pp. 1188-1200, vol. 47, No. 11, IEEE Computer Society, United States.
(Continued)

*Primary Examiner* — Esaw Abraham
(74) *Attorney, Agent, or Firm* — Sherman IP LLP; Kenneth L. Sherman; Hemavathy Perumal

(57) ABSTRACT

Embodiments of the invention provide a scan test system for an integrated circuit comprising multiple processing elements. The system comprises at least one scan input component and at least one scan clock component. Each scan input component is configured to provide a scan input to at least two processing elements. Each scan clock component is configured to provide a scan clock signal to at least two processing elements. The system further comprises at least one scan select component for selectively enabling a scan of at least one processing element. Each processing element is configured to scan in a scan input and scan out a scan output when said the processing element is scan-enabled. The system further comprises an exclusive-OR tree comprising multiple exclusive-OR logic gates. The said exclusive-OR tree generates a parity value representing a parity of all scan outputs scanned out from all scan-enabled processing elements.

18 Claims, 12 Drawing Sheets

(56) References Cited

U.S. PATENT DOCUMENTS

| | | | |
|---|---|---|---|
| 5,970,241 A | 10/1999 | Deao | |
| 6,081,885 A | 6/2000 | Deao | |
| 6,112,298 A | 8/2000 | Deao | |
| 6,539,536 B1 | 3/2003 | Singh | |
| 6,557,129 B1 * | 4/2003 | Rajski | G01R 31/31854 714/729 |
| 6,957,403 B2 | 10/2005 | Wang | |
| 6,971,054 B2 * | 11/2005 | Kurtulik | G01R 31/3185 714/732 |
| 7,058,869 B2 | 6/2006 | Abdel-Hafez et al. | |
| 7,197,681 B2 | 3/2007 | Dervisoglu | |
| 7,197,725 B2 * | 3/2007 | Takeoka | G01R 31/31855 714/731 |
| 7,206,983 B2 | 4/2007 | Alyamani | |
| 7,263,642 B1 * | 8/2007 | Makar | G01R 31/31856 714/736 |
| 7,649,395 B2 * | 1/2010 | Ahmadi | G01R 31/31858 327/202 |
| 7,783,946 B2 * | 8/2010 | Parulkar | G01R 31/31853 714/726 |
| 7,831,871 B2 | 11/2010 | Ross | |
| 7,919,981 B2 * | 4/2011 | Irie | G06F 17/505 326/46 |
| 8,065,651 B2 | 11/2011 | Kapur et al. | |
| 8,214,172 B2 * | 7/2012 | Wang | G01R 31/31854 702/117 |
| 8,516,317 B2 | 8/2013 | Nadeau-Dostie | |
| 8,533,547 B2 * | 9/2013 | Rajski | G01R 31/31854 714/727 |
| 8,645,778 B2 * | 2/2014 | Tekumalla | G01R 31/31853 714/726 |
| 8,683,278 B2 | 3/2014 | Miura | |
| 8,856,602 B2 * | 10/2014 | Brown | G01R 31/31856 714/726 |
| 9,186,459 B2 * | 11/2015 | Bechmann | A61M 5/2033 |

OTHER PUBLICATIONS

Kim, I. et al., "Scan Cell Grouping Algorithm for Low Power Design", Journal of Electrical Engineering and Technology, Mar. 2008, pp. 130-134, vol. 3, No. 1, The Korean Institute of Electrical Engineers, Korea.

Kapur, R. et al., "DFTMAX Compression Backgrounder, Maximun Test Reduction", Synopsys, Inc., Fall 2009, pp. 1-5, United States.

Tang, H. et al., "On Reducing Test Data Volume and Test Application Time for Multiple Scan Chain Designs", Proceedings of the 2003 International Test Conference (ITC), 2003, pp. 1079-1088, IEEE, United States.

U.S. Notice of Allowance for U.S. Appl. No. 14/229,739 mailed Sep. 16, 2015.

* cited by examiner

INITIALIZING AND TESTING INTEGRATED CIRCUITS WITH SELECTABLE SCAN CHAINS WITH EXCLUSIVE-OR OUTPUTS This invention was made with Government support under HR0011-09-C-0002 awarded by Defense Advanced Research Projects Agency (DARPA). The Government has certain rights in this invention.

BACKGROUND

Embodiments of the invention relate to integrated circuits, and in particular, initializing and testing integrated circuits.

An integrated circuit comprises a set of electronic circuits disposed on a semiconductor wafer or substrate. The set of electronic circuits may include multiple processing elements. There are different types of processing elements, such as microprocessors, microcontrollers, digital signal processors, graphics processors, reconfigurable processors, fixed function units, hardware accelerators, neurosynaptic neural core circuits, etc. The processing elements may be arranged in a one-dimensional grid arrangement, a two-dimensional grid arrangement, a three-dimensional grid arrangement, or in a ring or torus topology. The processing elements may be interconnected, thereby enabling packet communication between the processing elements.

Manufacturing testing of a semiconductor integrated circuit is an essential part of the production of the processing elements. Typically, manufacturing testing is carried out using a scanning methodology that scans in test data into an integrated circuit with a scan chain. A scan chain may comprise long shift registers. A test is then run by driving the integrated circuit using the scanned in test data, and collecting test results for the integrated circuit. The test results are scanned out of the scan chain.

The bigger/larger the size of an integrated circuit, the longer its scan chain. As such, it takes a proportionally longer time to scan in test data and scan out test results for a bigger/larger-sized integrated circuit, thereby increasing the time for testing the integrated circuit and increasing the cost of production. A number of compression schemes and built-in-test circuits are available to mitigate this problem. However, a built-in-test circuit consumes area and power, and increases the complexity of the integrated circuit.

For example, in a processing system with multiple units on a chip (e.g., many-core processors, neuromorphic processors, GPU, and FPGA chips), implementing a built-in-test circuit for each unit becomes cost prohibitive. Further, implementing a centralized built-in-test circuit for the processing system may not easily resolve the problems of increased time for testing and increased complexity of the integrated circuit.

Further, if a scan chain is also used to initialize an integrated circuit, a longer scan chain may lead to slow bring-up time of a digital system implemented using the integrated circuit. Fast scan chaining system are needed for speedy initialization. For example, in an integrated circuit that may not have a high speed clock (e.g., a neuromorphic circuit), fast initialization of the integrated circuit using a slow clock is essential.

BRIEF SUMMARY

In one embodiment, a scan test system for an integrated circuit comprising multiple processing elements is provided. The system comprises at least one scan input component and at least one scan clock component. Each scan input component is configured to provide a scan input to at least two processing elements. Each scan clock component is configured to provide a scan clock signal to at least two processing elements. The system further comprises at least one scan select component for selectively enabling a scan of at least one processing element. Each processing element is configured to scan in a scan input and scan out a scan output when said the processing element is scan-enabled. The system further comprises an exclusive-OR tree comprising multiple exclusive-OR logic gates. The said exclusive-OR tree generates a parity value representing a parity of all scan outputs scanned out from all scan-enabled processing elements.

Another embodiment provides a method for initializing and testing an integrated circuit comprising multiple processing elements. The method comprises providing a scan input to at least two of the multiple processing elements, and selectively enabling a scan of at least one of the multiple processing elements. Each processing element is configured to scan in a scan input and scan out a scan output when the processing element is scan-enabled. The method further comprises generating a parity value representing a parity of all scan outputs scanned out from all scan-enabled processing elements using an exclusive-OR tree comprising multiple exclusive-OR logic gates.

These and other features, aspects and advantages of the present invention will become understood with reference to the following description, appended claims and accompanying figures.

DETAILED DESCRIPTION

Figure 1A:
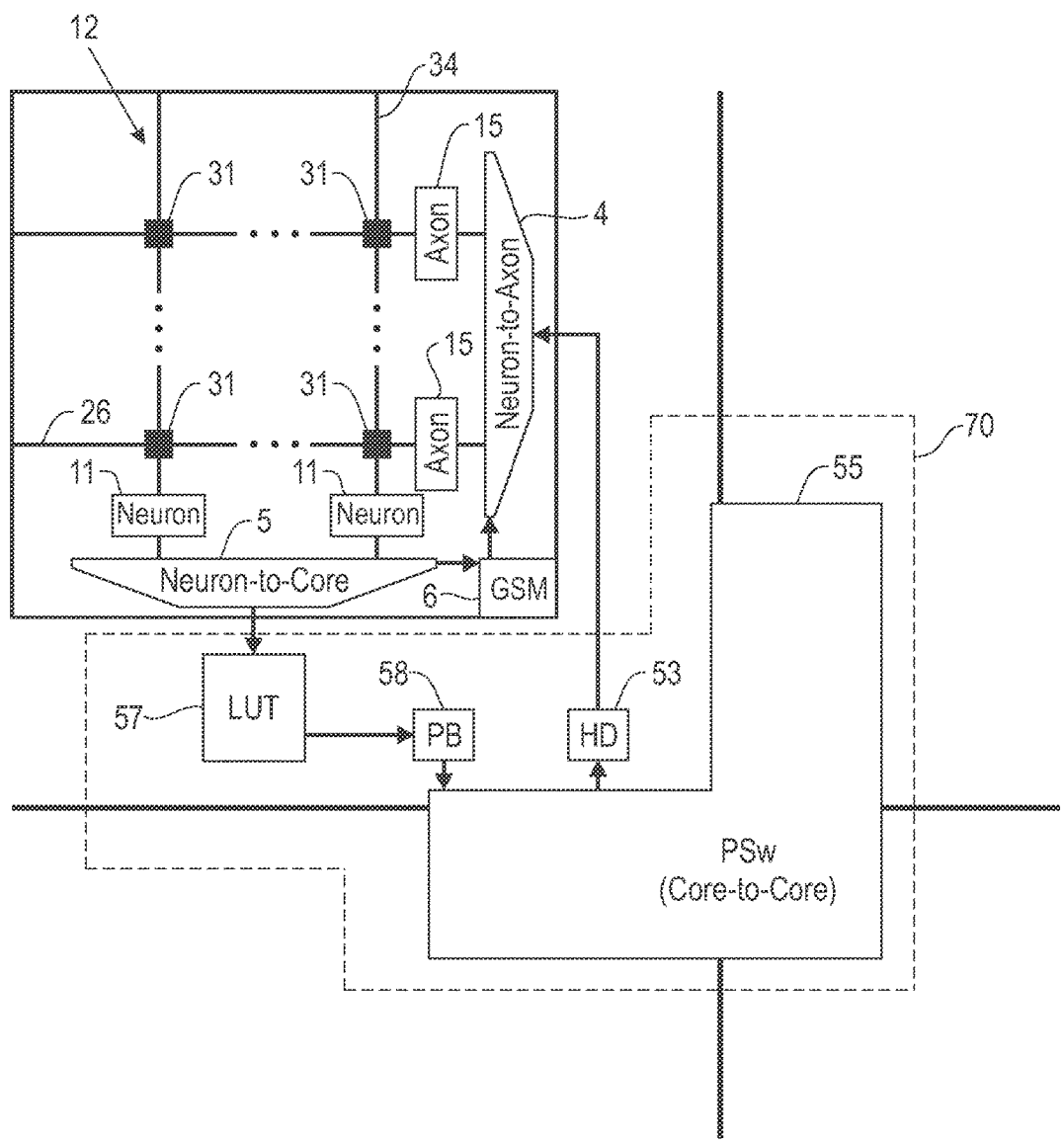
FIG. 1A illustrates an example neurosynaptic core circuit ("core circuit"), in accordance with an embodiment of the invention.

Embodiments of the invention relate to integrated circuits, and in particular, initializing and testing integrated circuits. One embodiment provides a scan test system for an integrated circuit comprising multiple processing elements. The scan test system allows for scan input to be provided to at least two processing elements in parallel. The scan test system can selectively enable a scan of at least one processing element based on scan input provided. Each scan-enabled processing element scans in scan input and scans out a resulting scan output. Scan outputs scanned out from scan-enabled processing elements may be compared against expected test results to determine whether testing of the circuit is successful.

In one embodiment, a neurosynaptic system comprises a system that implements neuron models, synaptic models, neural algorithms, and/or synaptic algorithms. In one embodiment, a neurosynaptic system comprises software components and/or hardware components, such as digital hardware, analog hardware or a combination of analog and digital hardware (i.e., mixed-mode).

The term electronic neuron as used herein represents an architecture configured to simulate a biological neuron. An electronic neuron creates connections between processing elements that are roughly functionally equivalent to neurons of a biological brain. As such, a neuromorphic and synaptronic computation comprising electronic neurons according to embodiments of the invention may include various electronic circuits that are modeled on biological neurons. Further, a neuromorphic and synaptronic computation comprising electronic neurons according to embodiments of the invention may include various processing elements (including computer simulations) that are modeled on biological neurons. Although certain illustrative embodiments of the invention are described herein using electronic neurons comprising electronic circuits, the present invention is not limited to electronic circuits. A neuromorphic and synaptronic computation according to embodiments of the invention can be implemented as a neuromorphic and synaptronic architecture comprising circuitry, and additionally as a computer simulation. Indeed, embodiments of the invention can take the form of an entirely hardware embodiment, an entirely software embodiment or an embodiment containing both hardware and software elements.

The term electronic axon as used herein represents an architecture configured to simulate a biological axon that transmits information from one biological neuron to different biological neurons. In one embodiment, an electronic axon comprises a circuit architecture. An electronic axon is functionally equivalent to axons of a biological brain. As such, neuromorphic and synaptronic computation involving electronic axons according to embodiments of the invention may include various electronic circuits that are modeled on biological axons. Although certain illustrative embodiments of the invention are described herein using electronic axons comprising electronic circuits, the present invention is not limited to electronic circuits.

FIG. 1A illustrates an example neurosynaptic core circuit ("core circuit") 10, in accordance with an embodiment of the invention. The core circuit 10 comprises a plurality of electronic neurons ("neurons") 11 and a plurality of electronic axons ("axons") 15. The neurons 11 and the axons 15 are interconnected via an m×n crossbar 12 comprising multiple intra-core electronic synapse devices ("synapses") 31, multiple rows/axon paths 26, and multiple columns/dendrite paths 34, wherein "×" represents multiplication, and m and n are positive integers.

Each synapse 31 communicates firing events (e.g., spike events) between an axon 15 and a neuron 11. Specifically, each synapse 31 is located at cross-point junction between an axon path 26 and a dendrite path 34, such that a connection between the axon path 26 and the dendrite path 34 is made through the synapse 31. Each axon 15 is connected to an axon path 26, and sends firing events to the connected axon path 26. Each neuron 11 is connected to a dendrite path 34, and receives firing events from the connected dendrite path 34. Therefore, each synapse 31 interconnects an axon 15 to a neuron 11, wherein, with respect to the synapse 31, the axon 15 and the neuron 11 represent an axon of a pre-synaptic neuron and a dendrite of a post-synaptic neuron, respectively.

Each synapse 31 and each neuron 11 has configurable operational parameters. In one embodiment, the core circuit 10 is a uni-directional core, wherein the neurons 11 and the axons 15 of the core circuit 10 are arranged as a single neuron array and a single axon array, respectively. In another embodiment, the core circuit 10 is a bi-directional core, wherein the neurons 11 and the axons 15 of the core circuit 10 are arranged as two neuron arrays and two axon arrays, respectively. For example, a bi-directional core circuit 10 may have a horizontal neuron array, a vertical neuron array, a horizontal axon array and a vertical axon array, wherein the crossbar 12 interconnects the horizontal neuron array and the vertical neuron array with the vertical axon array and the horizontal axon array, respectively.

In response to the firing events received, each neuron 11 generates a firing event according to a neuronal activation function. A preferred embodiment for the neuronal activation function can be leaky integrate-and-fire.

An external two-way communication environment may supply sensory inputs and consume motor outputs. The neurons 11 and axons 15 are implemented using complementary metal-oxide semiconductor (CMOS) logic gates that receive firing events and generate a firing event according to the neuronal activation function. In one embodiment, the neurons 11 and axons 15 include comparator circuits that generate firing events according to the neuronal activation function. In one embodiment, the synapses 31 are implemented using 1-bit static random-access memory (SRAM) cells. Neurons 11 that generate a firing event are selected one at a time, and the firing events are delivered to target axons 15, wherein the target axons 15 may reside in the same core circuit 10 or somewhere else in a larger system with many core circuits 10.

As shown in FIG. 1A, the core circuit 10 further comprises an address-event receiver (Core-to-Axon) 4, an address-event transmitter (Neuron-to-Core) 5, and a controller 6 that functions as a global state machine (GSM). The address-event receiver 4 receives firing events and transmits them to target axons 15. The address-event transmitter 5 transmits firing events generated by the neurons 11 to the core circuits 10 including the target axons 15.

The controller 6 sequences event activity within a time-step. The controller 6 divides each time-step into operational phases in the core circuit 10 for neuron updates, etc. In one embodiment, within a time-step, multiple neuron updates and synapse updates are sequentially handled in a read phase and a write phase, respectively. Further, variable time-steps may be utilized wherein the start of a next time-step may be triggered using handshaking signals whenever the neuron/synapse operation of the previous time-step is completed. For external communication, pipelining may be utilized wherein load inputs, neuron/synapse operation, and send outputs are pipelined (this effectively hides the input/output operating latency).

As shown in FIG. 1A, the core circuit 10 further comprises a routing fabric 70. The routing fabric 70 is configured to selectively route neuronal firing events among core circuits 10. The routing fabric 70 comprises a firing events address lookup table (LUT) module 57, a packet builder (PB) module 58, a head delete (HD) module 53, and a core-to-core packet switch (PSw) 55. The LUT 57 is an N address routing table is configured to determine target axons 15 for firing events generated by the neurons 11 in the core circuit 10. The target axons 15 may be axons 15 in the same core circuit 10 or other core circuits 10. The LUT 57 retrieves information such as target distance, direction, addresses, and delivery times (e.g., about 19 bits/packet×4 packets/neuron). The LUT 57 converts firing events generated by the neurons 11 into forwarding addresses of the target axons 15.

The PB 58 packetizes the routing information retrieved by the LUT 57 into outgoing address-event packets. The core-to-core PSw 55 is an up-down-left-right mesh router configured to direct the outgoing address-event packets to the core circuits 10 containing the target axons 15. The core-to-core PSw 55 is also configured to receive incoming address-event packets from the core circuits 10. The HD 53 removes routing information from an incoming address-event packet to deliver it as a time stamped firing event to the address-event receiver 4.

In one example implementation, the core circuit 10 may comprise 256 neurons 11. The crossbar 12 may be a 256× 256 ultra-dense crossbar array that has a pitch in the range of about 0.1 nm to 10 μm. The LUT 57 of the core circuit 10 may comprise 256 address entries, each entry of length 32 bits.

In one embodiment, soft-wiring in the core circuit 10 is implemented using address events (e.g., Address-Event Representation (AER)). Firing event (i.e., spike event) arrival times included in address events may be deterministic or non-deterministic.

Although certain illustrative embodiments of the invention are described herein using synapses comprising electronic circuits, the present invention is not limited to electronic circuits.

Figure 1B:
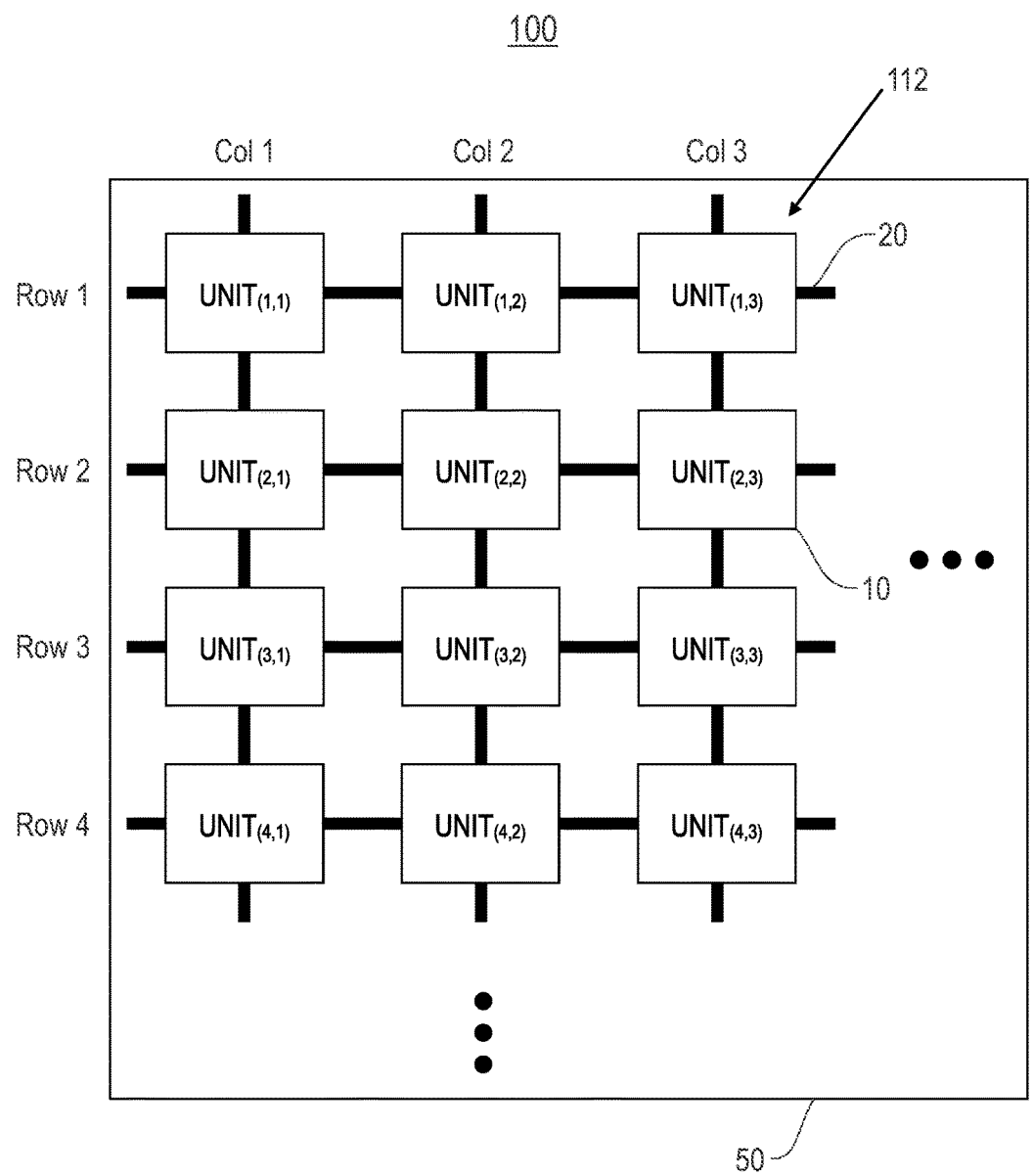
FIG. 1B illustrates a block diagram of an example integrated circuit ("chip circuit"), in accordance with an embodiment of the invention.

FIG. 1B illustrates a block diagram of an example integrated circuit ("chip circuit") 100, in accordance with an embodiment of the invention. The chip circuit 100 comprises multiple electronic component units 10 deposited on a semiconductor wafer/substrate 50. Each unit 10 is a processing element configured for performing arithmetical, logical, and/or input/output (I/O) operations. In one embodiment, each unit 10 is a neurosynaptic neural core circuit 10. In another embodiment, each unit 10 is another type of processing element, such as a microprocessor, a microcontroller, a digital signal processor, a graphics processor, a reconfigurable processor, a fixed function unit, a hardware accelerator, a logic gate, etc.

The units 10 are electrically interconnected via a plurality of connections 20. The units 10 may be arranged in a one-dimensional grid arrangement, a two-dimensional grid arrangement, a three-dimensional grid arrangement, or in a ring or torus topology.

For example, as shown in FIG. 1B, the units 10 may be arranged in a two-dimensional grid arrangement (e.g., a two-dimensional array) 112. Each unit 10 may be identified by its Cartesian coordinates as unit (i, j), wherein i is a row index and j is a column index of the grid arrangement 112. For example, a unit 10 at row 1 and column 3 of the grid arrangement 112 is identified as unit (1, 3).

Figure 2:
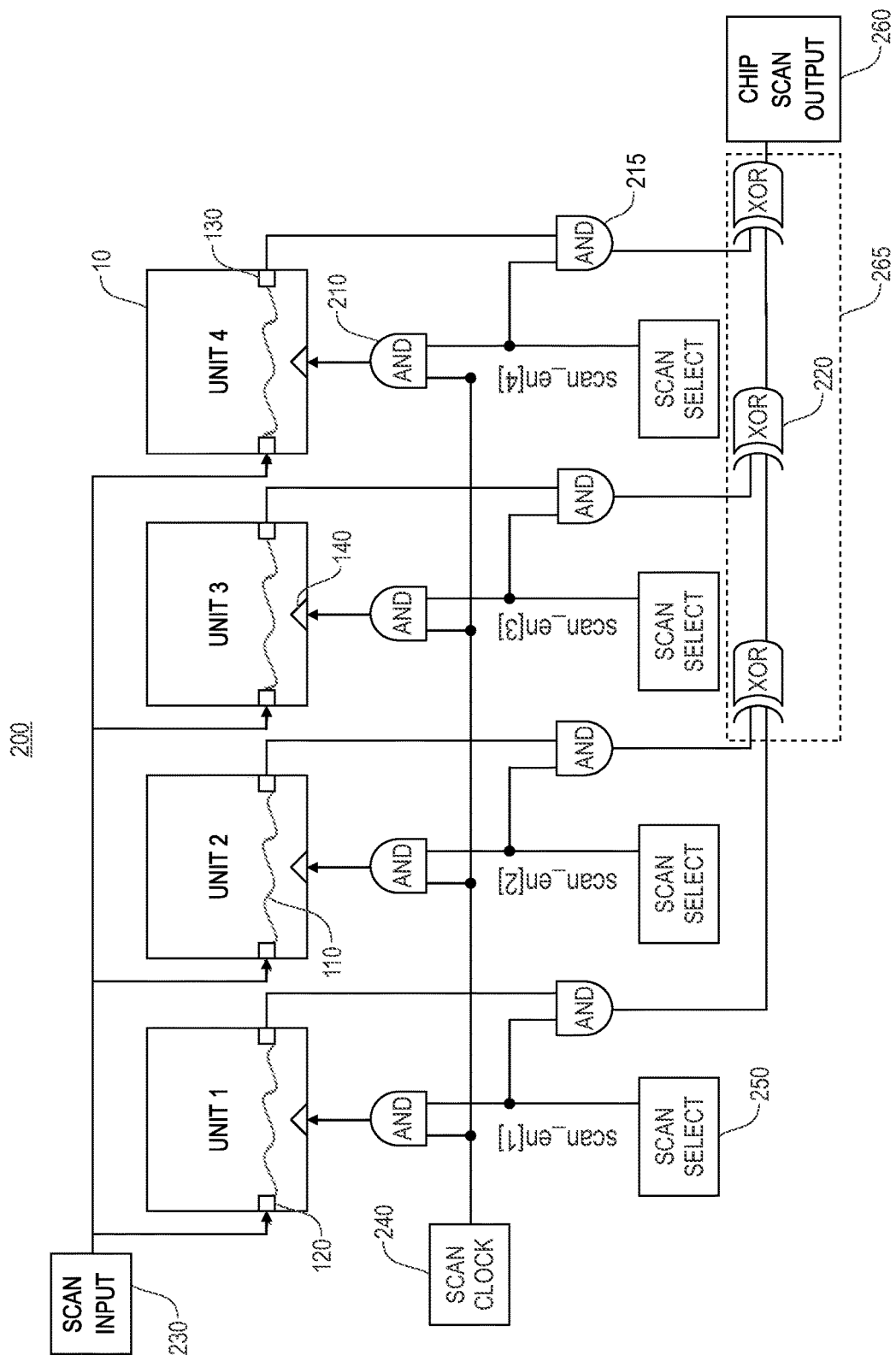
FIG. 2 illustrates an example scan system for a chip circuit, in accordance with an embodiment of the invention.

FIG. 2 illustrates an example scan system 200 for a chip circuit 100, in accordance with an embodiment of the invention. Each unit 10 of a chip circuit 100 comprises at least one scan chain 110 for initializing and/or testing electronic circuits within the unit 10. For example, a scan chain 110 of a unit 10 may initialize and/or test latches and/or memory cells of the unit 10. In one embodiment, all units 10 of the chip circuit 100 have identical scan chains 110 of the same length. In another embodiment, different units 10 of the chip circuit 100 have different scan chains 110 (i.e., different scan chain configurations). Therefore, the scan system 200 described in detail later herein may be applied to a chip circuit 100 comprising multiple units 10 having identical scan chains 110 as well as a chip circuit 100 comprising multiple units 10 having different scan chains 110.

Each unit 10 further comprises a scan input port 120 for receiving a scan input, a scan clock port 140 for receiving a scan clock signal, and a scan output port 130 for providing a unit scan output. A scan clock signal received by a unit 10 activates/drives a scan chain 110 of the unit 10 to scan in a scan input via a scan input port 120 of the unit 10. A scan input may comprise one or more scan values. If a scan chain 110 of a unit 10 is activated, a scan output port 130 of the unit 10 scans out a unit scan output indicating whether the initialization and/or testing of the unit 10 is successful.

In one embodiment, the initialization and/or testing of a unit 10 is successful if the unit 10 scans out a deterministic/expected unit scan output. For example, to test a unit 10, test data (e.g., test vectors/test patterns) are scanned in through a scan chain 110 of the unit 10. The scanned in test data initialize internal circuits of the unit 10. A circuit test is then run on the unit 10. During the circuit test, a scan enable signal for the unit 10 is disabled, the chip circuit 10 operates in a normal operation mode, and a clock for the unit 10 is toggled once to drive the internal circuits of the unit 10 for one time step. Driving the internal circuits of the unit 10 updates the contents of the scan chain 110 (e.g., updates in a deterministic manner if there are no defects). The updated contents of the scan chain 110 are then scanned out as test results. The scanned out test results are compared against expected test results (e.g., derived from a simulation). If the scanned out test results match the expected test results, testing of the unit 10 is successful.

In one embodiment, a unit 10 may have multiple scan chains 110. The scan chains 110 may share the same scan input port 120 and the same scan output port 130 of the unit 10. For example, multiplexors may be used to facilitate the sharing of the scan input port 120 and the scan output port 130.

In one embodiment, a unit 10 may receive multiple scan clock signals. For example, in one embodiment, a scan system implementing level-sensitive scan design (LSSD) utilizes multiple non-overlapping scan clock signals to drive each scan chain 110 of the unit 10.

A scan system 200 may be used to control the scan chains 110 of two or more units 10 of the chip circuit 100. As described in detail later herein, the scan system 200 may selectively enable/activate scan chains 110 of some units 10, and disable/inactivate scan chains 110 of other units 10. Scan input may progress through only the units 10 with enabled/activated scan chains 110, while the current state of other units 10 with disabled/inactivated scan chains 110 is preserved. The scan system may also provide, in parallel, the same scan input to each unit 10 with an enabled/activated scan chain 110, thereby increasing the speed at which the chip circuit 100 is initialized/tested.

The scan system 200 comprises at least one scan input component 230. A scan input component 230 provides, in parallel, identical (i.e., the same) scan input to two or more units 10 of the chip circuit 100. For example, as shown in FIG. 2, a scan input component 230 is connected to a scan input port 120 of multiple units 10, such as Unit 1, Unit 2, Unit 3 and Unit 4. The scan input component 230 provides identical scan input to Unit 1, Unit 2, Unit 3 and Unit 4.

In one embodiment, the scan input component 230 is directly connected to an input pin/pad of chip circuit 100, wherein the input pin/pad receives and is driven by electrical signals from outside the chip circuit 100. In another embodiment, the scan input component 230 is part of a design-for-test (DFT) circuit built into the chip circuit 100.

The scan system 200 further comprises a scan clock component 240 for providing a scan clock signal to two or more units of the chip circuit 10. For example, as shown in FIG. 2, a scan clock component 240 is connected to a scan clock port 140 of multiple units 10, such as Unit 1, Unit 2, Unit 3 and Unit 4.

In one embodiment, the scan system 200 selectively enables/activates a scan chain 110 of a unit 10 using a scan enable signal for the unit 10. Specifically, the scan system 200 further comprises at least one scan select component 250 and at least one AND unit 210. A scan select component 250 generates a scan enable signal for a corresponding unit 10. In this specification, let scan_en[i] denote a scan enable signal for unit i of the chip circuit 100, wherein i is a positive integer. For example, as shown in FIG. 2, a first scan select component 250 generates a first scan enable signal scan_en[1] for Unit 1, a second scan select component 250 generates a second scan enable signal scan_en[2] for Unit 2, a third scan select component 250 generates a third scan enable signal scan_en[3] for Unit 3, and a fourth scan select component 250 generates a fourth scan enable signal scan_en[4] for Unit 4.

In one embodiment, each scan select component 250 is directly connected to an input pin/pad of chip circuit 100, wherein the input pin/pad receives and is driven by electrical signals from outside the chip circuit 100. In another embodiment, each scan select component 250 is part of a design-for-test (DFT) circuit built into the chip circuit 100.

In one embodiment, a scan select component 250 sets a scan enable signal for a corresponding unit 10 to either '1' or '0'. A scan chain 110 of a unit 10 is enabled/activated when the unit 10 receives both a scan clock signal and a scan enable signal set to '1'. As shown in FIG. 2, for each unit 10, a scan clock signal is AND'ed with a scan enable signal for the unit 10 using an AND unit 210. The AND of the scan clock signal and the scan enable signal is provided as input to a scan clock port 140 of the unit 10. The scan chain 110 of the unit 10 is enabled/activated if the AND of the scan clock signal and the scan enable signal is '1' (i.e., the unit 10 has received both a scan clock signal and a scan enable signal set to '1'). The scan chain 110 of the unit 10 is disabled/inactivated if the AND of the scan clock signal and the scan enable signal is '0' (i.e., the unit 10 has not received a scan clock signal and/or the scan enable signal for the unit 10 is set to '0'). In another embodiment, a local clock buffer is used in lieu of an AND unit 210. The local clock buffer buffers a scan clock signal from the scan clock component 240, and propagates the buffered scan clock signal as input to the scan clock port 140 of the unit 10 only when the scan enable signal is set to '1'.

The scan system 200 further comprises a chip scan output component 260 for maintaining a chip scan output. A chip scan output indicates whether the initialization and/or testing of the entire chip circuit 100 is successful. The chip scan output is based on unit scan outputs scanned out by units 10 of the chip circuit 100.

The scan system 200 further comprises at least one AND unit 215. As shown in FIG. 2, for each unit 10, a scan enable signal for the unit 10 is AND'ed with unit scan output scanned out of the scan chain 110 of the unit 10 using an AND unit 215. For example, the first scan enable signal scan_en[1] for Unit 1 is AND'ed with unit scan output scanned out of the scan chain 110 of Unit 1 using a first AND unit 215. The second scan enable signal scan_en[2] for Unit 2 is AND'ed with unit scan output scanned out of the scan chain 110 of Unit 2 using a second AND unit 215. The third scan enable signal scan_en[3] for Unit 3 is AND'ed with unit scan output scanned out of the scan chain 110 of Unit 3 using a third AND unit 215. The fourth scan enable signal scan_en[4] for Unit 4 is AND'ed with unit scan output scanned out of the scan chain 110 of Unit 4 using a fourth AND unit 215.

In one embodiment, the chip scan output is an exclusive-OR (XOR) of unit scan outputs scanned out by the scan-enabled units 10 of the chip circuit 100. Specifically, the scan system 200 further comprises an XOR tree 265 comprising one or more XOR units (i.e., XOR logic gates) 220 for determining the chip scan output. The XOR tree 265 is an example logic tree architecture, wherein the XOR units 220 are arranged to form multiple levels of XOR logic. For example, as shown in FIG. 2, the XOR tree 265 comprises a first XOR unit 220 representing a first level of XOR logic, a second XOR unit 220 representing a second level of XOR logic, and a third XOR unit 220 representing a third level of XOR logic. The first XOR unit 220 determines a first XOR value representing an XOR of output from the first AND unit 215 and the second AND unit 215. The second XOR unit 220 determines a second XOR value representing an XOR of the first XOR value and output from the third AND unit 215. The third XOR unit 220 determines a third XOR value representing an XOR of the second XOR value and output from the fourth AND unit 215. If Unit 1, Unit 2, Unit 3 and Unit 4 are the only units 10 of the chip circuit 10, the chip scan output of the chip circuit 10 is equal to the third XOR value. Therefore, if only the scan enable signals for Unit 1 and Unit 2 are set to '1', the chip scan output of the chip circuit 100 is the XOR of unit scan outputs scanned out by Unit 1 and Unit 2.

In one embodiment, the chip scan output component 260 is directly connected to an output pin/pad of the chip circuit 100, such that the chip scan output is directly sent outside the chip circuit 100. In another embodiment, the chip scan output component 260 forwards the chip scan output to a DFT circuit built into the chip circuit 100.

In one embodiment, the scan system 100 has multiple operating modes, such as an individual scan mode, a parallel scan mode, and a delayed scan mode. In the individual scan mode, only one unit 10 of the chip circuit 100 is scan-enabled (i.e., the scan chain 110 of only one unit 10 is enabled/activated). For example, to scan-enable only unit i of the chip circuit 100, the scan chain 110 of unit i is enabled/activated by setting the scan enable signal for unit i to '1' (i.e., scan_en[i]=1). The scan chains 110 of all other units 10 of the chip circuit 100 are disabled/inactivated by setting the scan enable signals for all the other units 10 to '0'

(i.e., scan_en[j]=0, wherein j !=i). Therefore, the chip scan output of the chip circuit 100 is equal to the unit scan output of unit i.

In the parallel scan mode, all units 10 of the chip circuit 100 are scan-enabled (i.e., the scan chain 110 of all units 10 are enabled/activated). To scan-enable all units 10 of the chip circuit 100, all scan enable signals for the units 10 of the chip circuit 100 are set to '1'. Further, the scan input component 230 provides, in parallel, the same scan input to all units 10 of the chip circuit 100. Therefore, the chip scan output of the chip circuit 100 is the parity of all unit scan outputs scanned out by all units 10 of the chip circuit 100.

In one embodiment, the scan system 200 accelerates scan-based initialization of a chip circuit 100. For example, the parallel scan mode may be used to broadcast the same initialization data (e.g., initialization vectors) to all units 10 of the chip circuit 100. If initializing each unit 10 with different initialization data, the individual scan mode may be used to scan in unique initialization data into each unit 10 one at a time.

The parallel scan mode may be used to initialize all units 10 of the chip circuit 100 with the same configuration data. The parallel scan mode may also be used to perform a quick chip test on the chip circuit 100 by providing the same test pattern as scan input to all units 10 of the chip circuit 100, and analyzing the chip scan output against an expected chip scan output. If a single unit 10 fails during the chip test by producing an incorrect unit scan output, the chip scan output for the chip circuit 100 is different from the expected chip scan output. The chip test fails when the chip scan output for the chip circuit 100 differs from the expected chip scan output.

While the parallel scan mode may be used to detect a failed chip circuit 100, the parallel scan mode does not identify which units 10 of the chip circuit 100 contributed to the failure of the chip circuit 100 (i.e., failed units 10). To identify which units 10 of the chip circuit 100 are failed units 10, individual units 10 of the chip circuit 100 may be tested using the individual scan mode. In the alternative, a failed unit 10 may be identified using a binary search, wherein half of the units 10 receiving the same scan input are activated.

Further, in the parallel scan mode, if two units 10 connected to the same scan chain system 200 are failed units 10, an exclusive-OR of all unit scan outputs scanned out by units 10 connected to the scan chain system 200 may cancel out incorrect unit scan outputs of the two failed units 10. As a result, the parallel scan mode may fail to detect a failed chip circuit 100.

In the delayed scan mode, all units 10 of the chip circuit 100 are scan-enabled (i.e., the scan chain 110 of all units 10 are enabled/activated), however a scan chain 110 of at least one unit 10 is enabled/activated only after one or more clock delays have elapsed. In one embodiment, in the delayed scan mode, a scan enable signal scan_en[i] is set to '1' at clock cycle t if i≤t.

For example, when the clock cycle t=1, scan enable signal scan_en[1] for Unit 1 is set to '1', while the scan enable signals scan_en[2] for Unit 2, scan_en[3] for Unit 3, and scan_en[4] for Unit 4 are set to '0'. Only Unit 1 is scan-enabled during the first clock cycle. When the clock cycle t=2, scan enable signals scan_en[1] for Unit 1 and scan_en[2] for Unit 2 are set to '1', while the scan enable signals scan_en[3] for Unit 3 and scan_en[4] for Unit 4 are set to '0'. Only Unit 1 and Unit 2 are scan-enabled during the second clock cycle. When the clock cycle t=3, scan enable signals scan_en[1] for Unit 1, scan_en[2] for Unit 2 and scan_en[3] for Unit 3 are set to '1', while the scan enable signal scan_en[4] for Unit 4 is set to '0'. Only Unit 1, Unit 2 and Unit 3 are scan-enabled during the third clock cycle. When the clock cycle t≥4, scan enable signals scan_en[1] for Unit 1, scan_en[2] for Unit 2, scan_en[3] for Unit 3 and scan_en[4] for Unit 4 are all set to '1'. Unit 1, Unit 2, Unit 3 and Unit 4 are scan-enabled during the fourth clock cycle and each succeeding clock cycle.

In one embodiment, the parallel scan mode and the delayed scan mode may be combined to detect a failed chip circuit 100. By combining the parallel scan mode and the delayed scan mode, a failed chip circuit 100 may be detected, even when unit scan outputs of two failed units 10 cancel each other out. The failed units 10 contributing to the failure of the chip circuit 100 may be identified using triangulation.

Figure 3:
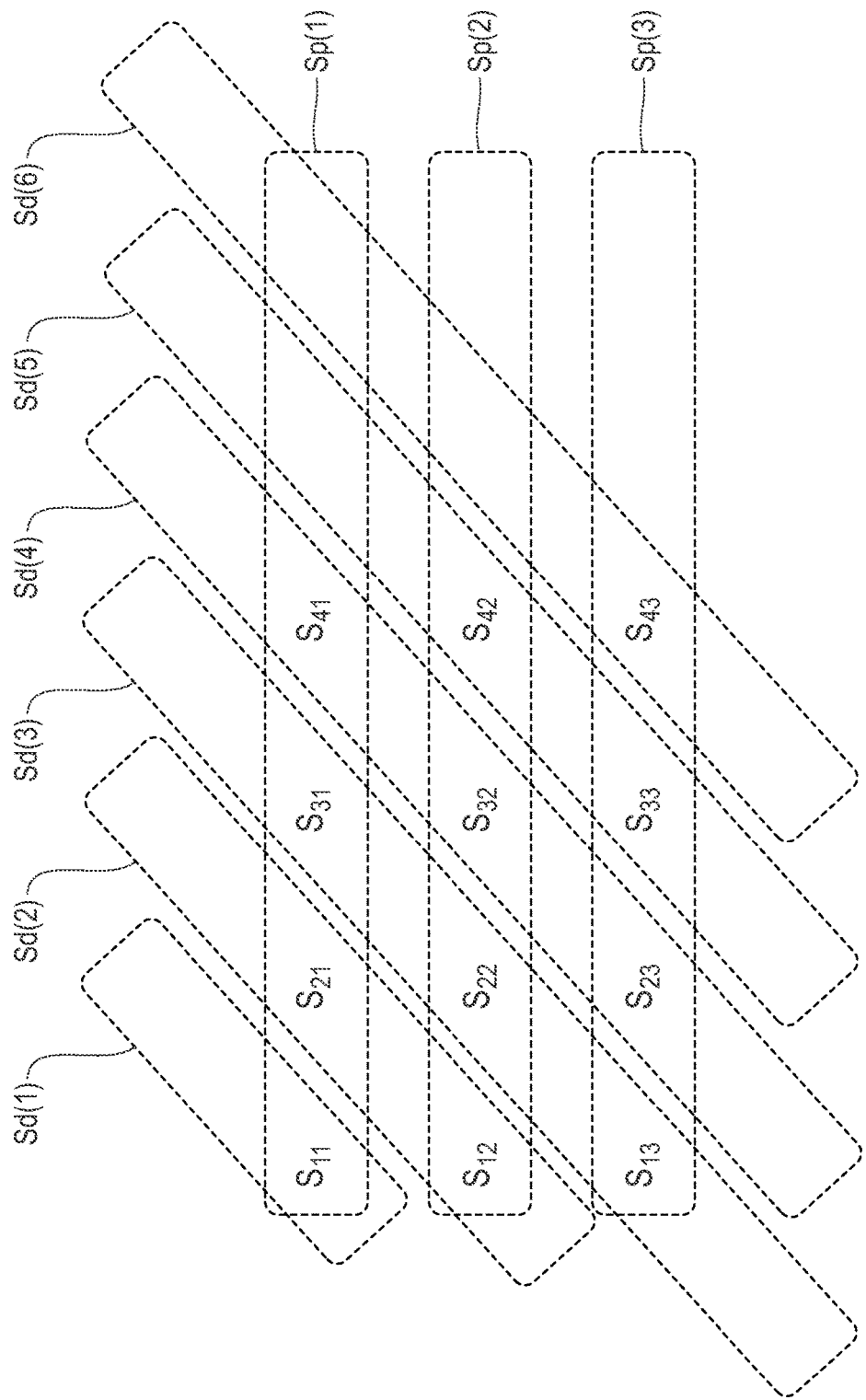
FIG. 3 illustrates an example triangulation process to identify a single failed unit of a chip circuit, in accordance with an embodiment of the invention.

FIG. 3 illustrates an example triangulation process to identify a single failed unit 10 of a chip circuit 100, in accordance with an embodiment of the invention. Assume a chip circuit 100 comprises n units 10, and each unit 10 scans in a scan input comprising m scan bits. A single defect in the entire n*m bits may be detected using triangulation. For example, FIG. 3 illustrates using triangulation to identify a single failed unit 10 of a chip circuit 100 comprising four units 10 (i.e., n=4), wherein each unit 10 scans in a scan input comprising three scan bits (i.e., m=3).

Let $S_{ij}$ represent a $j^{th}$ unit scan output of a unit i. To triangulate a failed unit 10 of the chip circuit 100, parities must be scanned out multiple times in both the parallel scan mode and the delayed scan mode. Let Sp(i) denote an $i^{th}$ chip scan output of the chip circuit 100 when the chip circuit 100 operates in the parallel scan mode, wherein 1≤i≤m. Let Sd(i) represent an $i^{th}$ chip scan output of the chip circuit 100 when the chip circuit 100 operates in the delayed scan mode with one clock delay in between scan start times, wherein 1≤i≤m+n−1.

For example, Unit 1, Unit 2, Unit 3 and Unit 4 may be scanned multiple times in the parallel scan mode followed by the delayed scan mode. As shown in FIG. 3, a first chip scan output Sp(1) of the chip circuit 100 in the parallel scan mode is the parity of $S_{11}$, $S_{21}$, $S_{31}$ and $S_{41}$. A second chip scan output Sp(2) of the chip circuit 100 in the parallel scan mode is the parity of $S_{12}$, $S_{22}$, $S_{32}$ and $S_{42}$. A third chip scan output Sp(3) of the chip circuit 100 in the parallel scan mode is the parity of $S_{13}$, $S_{23}$, $S_{33}$ and $S_{43}$. A first chip scan output Sd(1) of the chip circuit 100 in the delayed scan mode is $S_{11}$. A second chip scan output Sd(2) of the chip circuit 100 in the delayed scan mode is the parity of $S_{12}$ and $S_{21}$. A third chip scan output Sd(3) of the chip circuit 100 in the delayed scan mode is the parity of $S_{13}$, $S_{22}$ and $S_{31}$. A fourth chip scan output Sd(4) of the chip circuit 100 in the delayed scan mode is the parity of $S_{23}$, $S_{32}$ and $S_{41}$. A fifth chip scan output Sd(5) of the chip circuit 100 in the delayed scan mode is the parity of $S_{33}$ and $S_{42}$. A sixth chip scan output Sd(6) of the chip circuit 100 in the delayed scan mode is $S_{43}$.

To triangulate a failed unit 10 of the chip circuit 100, Sp(i) is compared against an expected chip scan output value to detect a flipped bit, if any. Sd(i) is also compared against an expected chip scan output value to detect a flipped bit, if any. Let Sp(x) denote a flipped bit in scan output in the parallel scan mode, wherein the flipped bit is the $x^{th}$ bit in the scan output. Let Sd(y) denote a flipped bit in scan output in the delayed scan mode, wherein the flipped bit is the $y^{th}$ bit in the scan output. The $x^{th}$ bit of the $(y-x+1)^{th}$ unit 10 has a defect bit.

For example, if the unit scan output $S_{23}$ is flipped (i.e., the third unit scan output of Unit 2 has a defect bit), both the third chip scan output Sp(3) of the chip circuit 100 in the parallel scan mode and the fourth chip scan output Sd(4) of the chip circuit 100 in the delayed scan mode will be opposite from an expected chip scan output. As x=3 and y=4, the third unit scan output of Unit 2 (i.e., 4-3+1) has a defect bit.

In one embodiment, the delay in scan start times between units 10 in the delayed scan mode may be longer than one clock cycle (i.e., a multiple delayed scan mode). For example, the scan chain 110 of a unit 10 may be enabled/activated 2, 3 or more clock cycles after the scan chain 110 of a preceding unit 10 has been enabled/activated. Combining the parallel scan mode and an increasing number of delayed scan modes with different delays minimizes the likelihood that a failed scan test goes undetected.

Further, the multiple delayed scan mode facilitates triangulation of multiple failed units 10. To triangulate multiple failed units 10 of the chip circuit 100, parities must be scanned out multiple times in both the parallel scan mode and the multiple delayed scan mode. Let Sp(i) denote an $i^{th}$ chip scan output of the chip circuit 100 when the chip circuit 100 operates in the parallel scan mode, wherein $1 \leq i \leq m$. Let Sd_k(i) represent an $i^{th}$ chip scan output of the chip circuit 100 when the chip circuit 100 operates in the multiple delayed scan mode with k clock delays in between scan start times, wherein $1 \leq i \leq m+(n-1)*k$. The $j^{th}$ bit of unit i contributes to the parity of Sp(j), Sd_1(j+i-1), Sd_2(j+2i-2), Sd_3 (j+3i-3) and so on. An n-m algorithm is applied in the multiple delayed scan mode to detect defect bits. Specifically, a scan test is run to generate n scan outputs Sp, Sd_1, Sd_2, Sd_3, . . . , Sd_n-1. For each bit, n parity bits from the n scan outputs are identified that cover the bit. If m out of n covering parities are correct, the bit is correct; otherwise, the bit is a defect bit.

Figure 4:
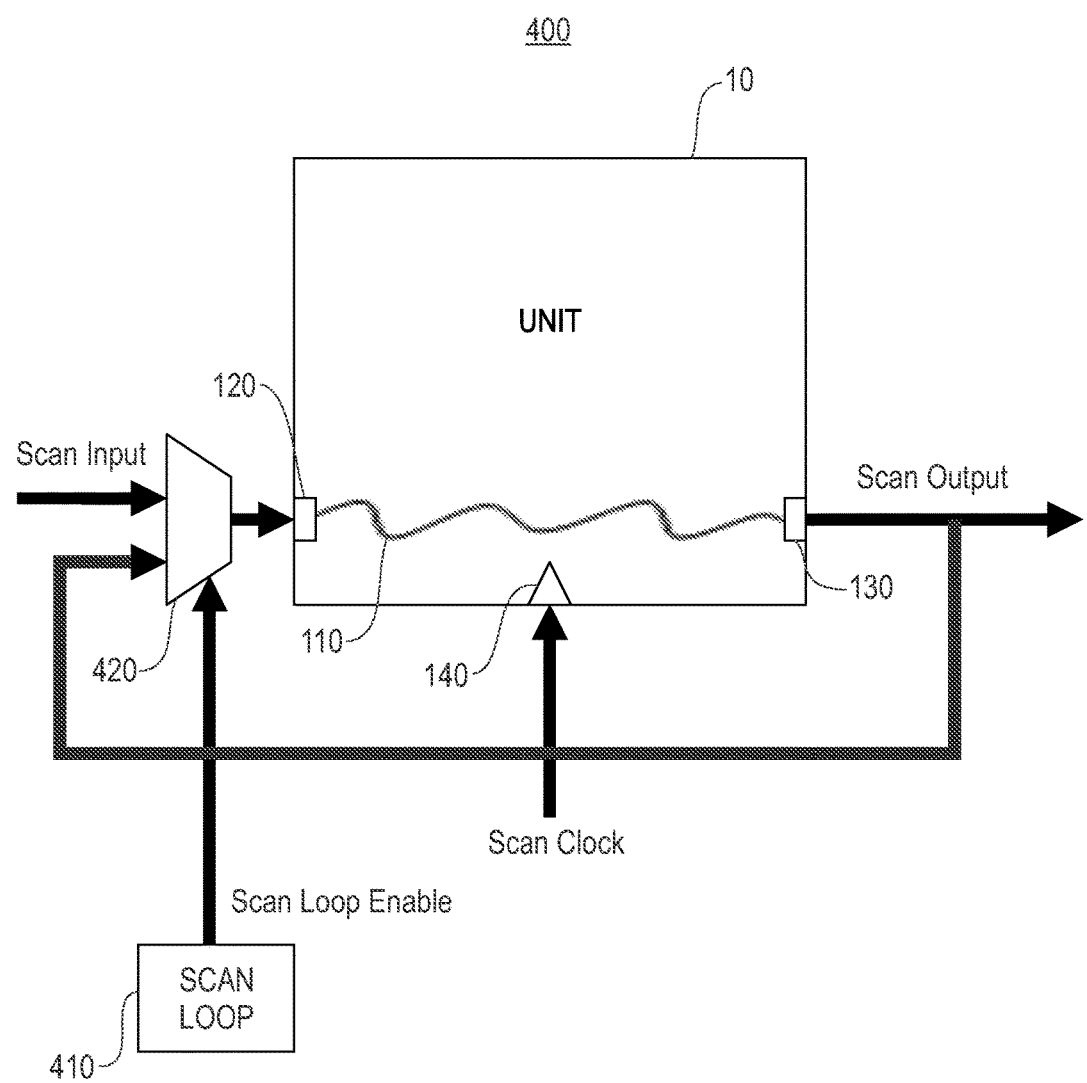
FIG. 4 illustrates an example scan loop system for a unit, in accordance with an embodiment of the invention.

FIG. 4 illustrates an example scan loop system 400 for a unit 10, in accordance with an embodiment of the invention. The scan loop system 400 comprises a multiplexor 420 and a scan loop component 410. The multiplexor 420 provides the scan chain 110 of the unit 10 with either a scan input (e.g., from a scan input component 230) or a most recent unit scan output generated by the scan chain 110. A scan loop enable signal provided by the scan loop component 410 controls which value the multiplexor 420 provides to the scan chain 110. The scan loop system 410 allows for the unit scan output to loop back into the scan chain 110 and scan out multiple times without losing a transient scan test result.

For example, the scan loop system 410 may be used to detect transient test failures and locate a failing bit by combining parallel and delayed scan modes. Combining parallel and delayed scan modes requires multiple reads of the same scan test results. The scan loop system 410 facilitates multiple reads of the same scan test results.

Figure 5:
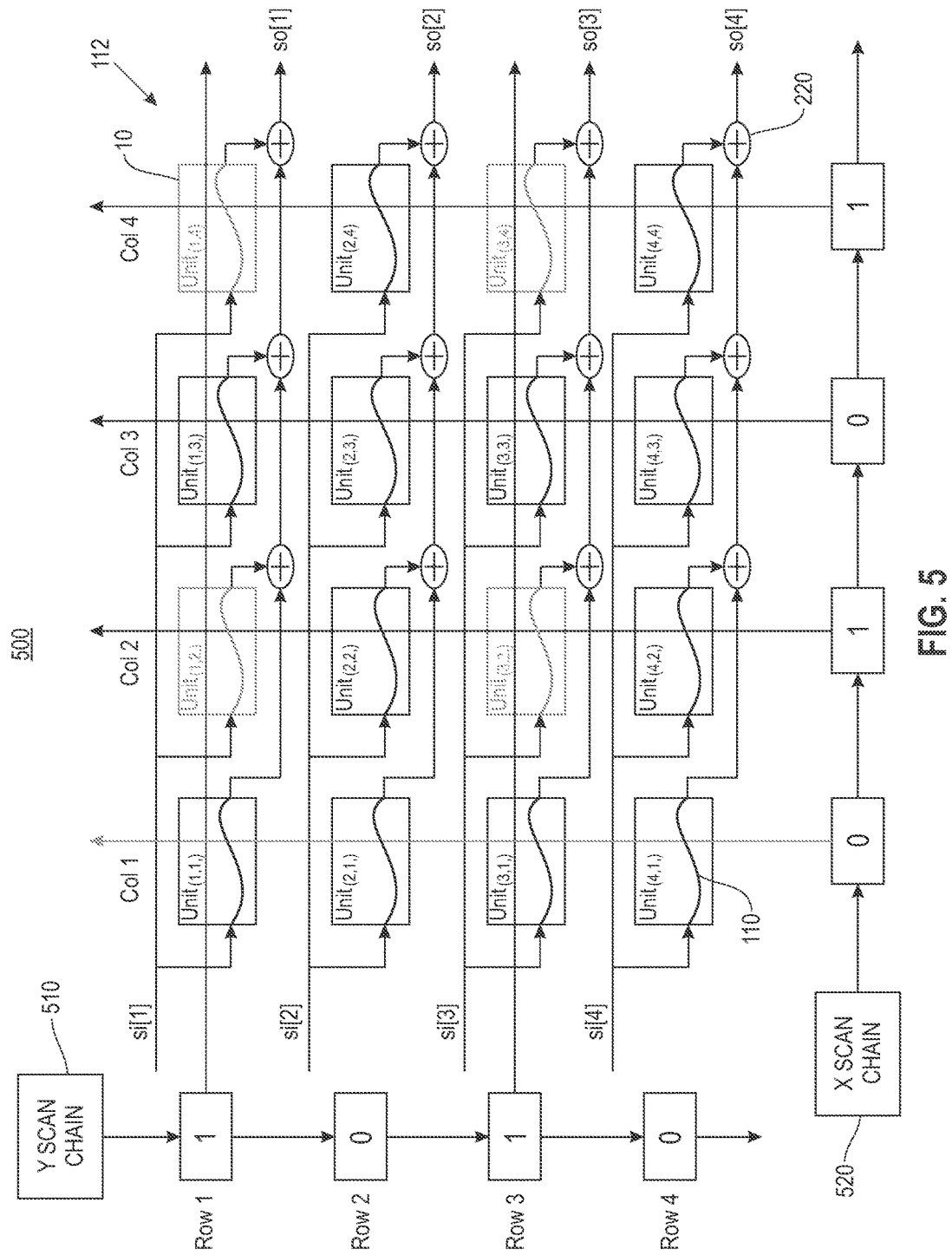
FIG. 5 illustrates another example scan system for a chip circuit, in accordance with an embodiment of the invention.

FIG. 5 illustrates another example scan system 500 for a chip circuit 100, in accordance with an embodiment of the invention. In one embodiment, a chip circuit 100 may comprises multiple units 10 arranged in a two-dimensional grid arrangement 112, as shown in FIG. 5. Each unit 10 may be identified by its Cartesian coordinates as unit (i, j), wherein i is a row index and j is a column index of the grid arrangement 112.

A scan chain 110 of a unit 10 is activated based on two scan enable signals, that is an x-coordinate scan enable signal and a y-coordinate scan enable signal. Specifically, the scan system 500 comprises a first scan chain component (Y scan chain) 510 for generating y-coordinate scan enable signals. The scan system 500 further comprises a second scan chain component (X scan chain) 520 for generating x-coordinate scan enable signals. In one embodiment, the first scan chain component 510 and the second scan chain component 520 at positioned on the left and at the bottom of the chip circuit 100, respectively.

Each row of the chip circuit 100 has a separate scan input and a separate scan output. Let si[i] denote the scan input for a row i. Let so[i] denote the scan output for a row i. The rows may be scanned in parallel.

A scan chain 110 for a unit 10 is activated if both an x-coordinate scan enable signal and a y-coordinate scan enable signal for the unit 10 is set to '1'. Let scan_en$_x$[j] denote a scan enable signal generated for an $j^{th}$ x-coordinate. Let scan_en$_y$[i] denote a scan enable signal generated for an $i^{th}$ y-coordinate. Unit (i,j) is scan enabled when both scan_en$_x$[j] and scan_en$_y$[i] are both enabled (i.e., set to '1'). For example, as shown in FIG. 5, x-coordinate scan enable signals are 0, 1, 0 and 1 for a first, a second, a third and a fourth x-coordinate, respectively. Each x-coordinate may be aligned with a column. The y-coordinate scan enable signals are 1, 0, 1 and 0 for a first, a second, a third and a fourth y-coordinate, respectively. Each y-coordinate may be aligned with a row. As a result, only unit (1,2), unit (1,4), unit (3,2) and unit (3,4) are scan enabled.

Figure 6:
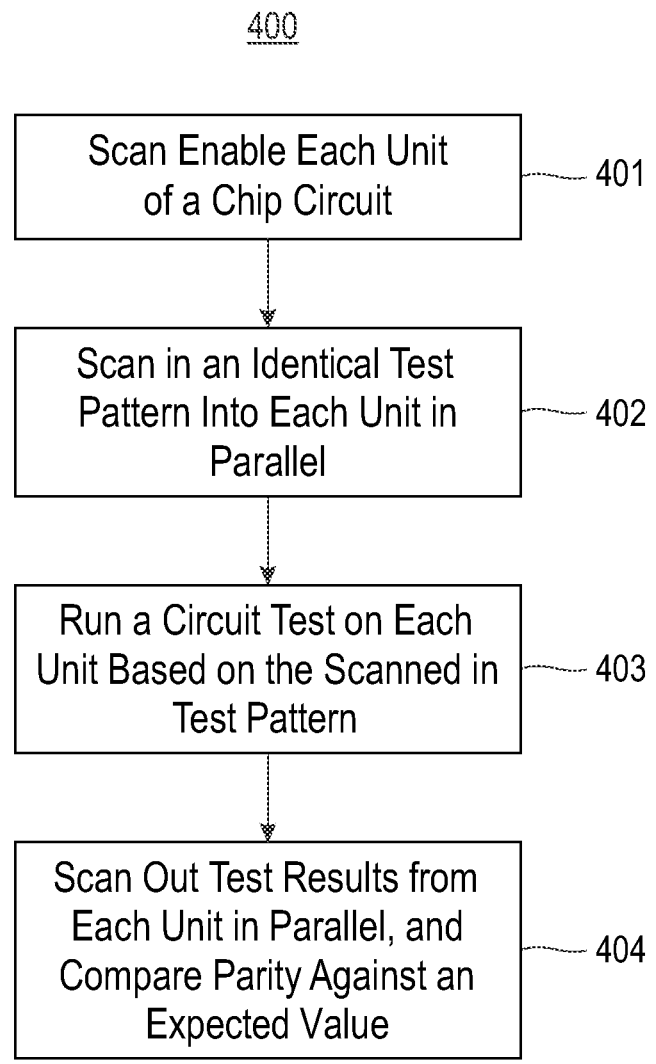
FIG. 6 illustrates a flowchart of an example process for scanning a chip circuit in a parallel scan mode, in accordance with an embodiment of the invention.

FIG. 6 illustrates a flowchart of an example process 400 for scanning a chip circuit in a parallel scan mode, in accordance with an embodiment of the invention. In process block 401, scan enable each unit of the chip circuit. In process block 402, scan in an identical test pattern into each unit in parallel. In process block 403, run a circuit test on each unit based on the scanned in test pattern. In process block 404, scan out test results from each unit in parallel, and compare parity against an expected value.

Figure 7:
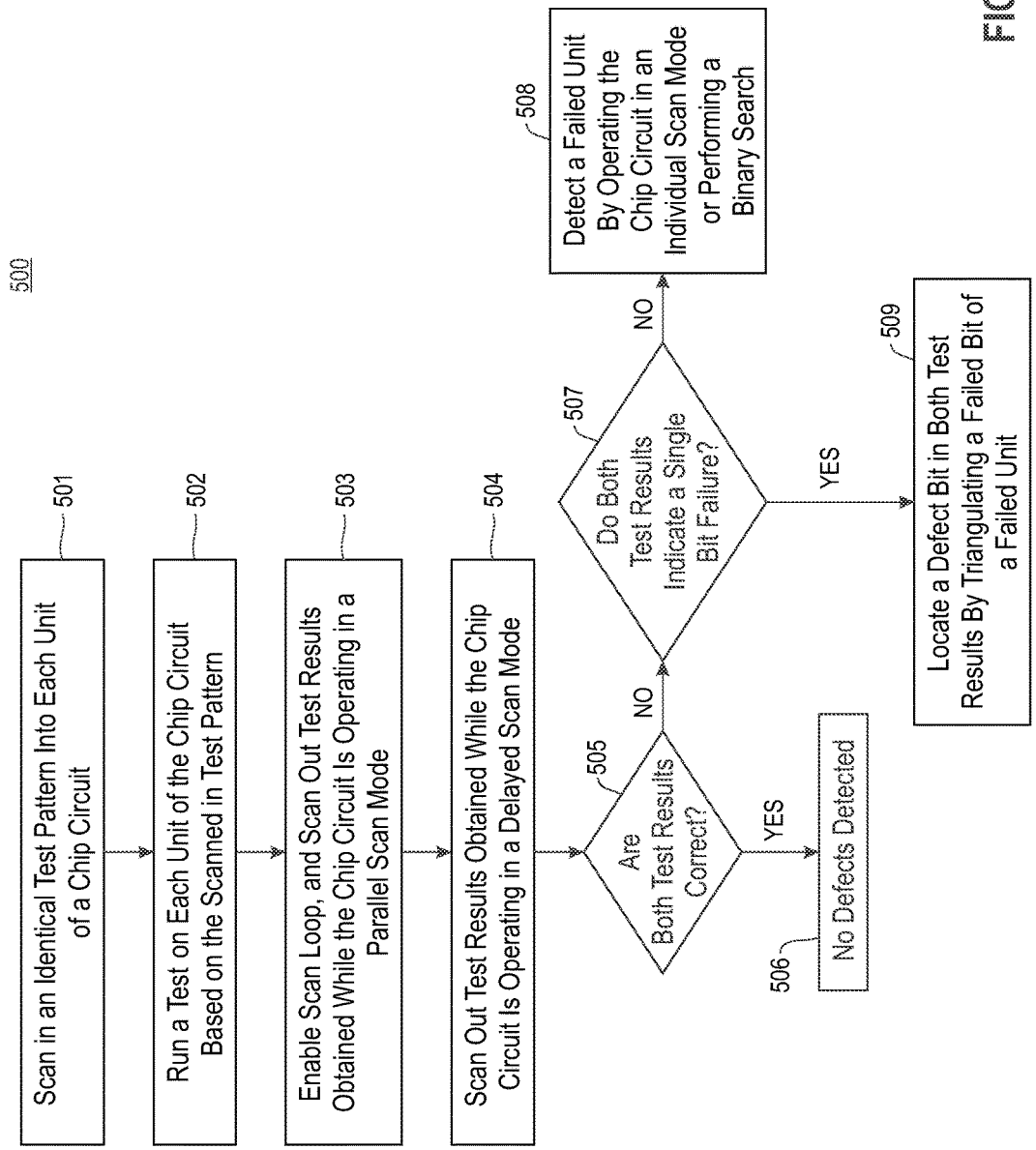
FIG. 7 illustrates a flowchart of an example process for triangulating a failed unit of a chip circuit using a parallel scan mode and a delayed scan mode, in accordance with an embodiment of the invention.

FIG. 7 illustrates a flowchart of an example process 500 for triangulating a failed unit of a chip circuit using a parallel scan mode and a delayed scan mode, in accordance with an embodiment of the invention. In process block 501, scan in an identical test pattern into each unit of the chip circuit. In process block 502, run a circuit test on each unit of the chip circuit based on the scanned in test pattern. In process block 503, enable scan loop, and scan out test results obtained while the chip circuit is operating in a parallel scan mode. In process block 504, scan out test results obtained while the chip circuit is operating in a delayed scan mode. In process block 505, determine whether both test results are correct (i.e., determine whether the test results obtained while the chip circuit is operating in the parallel scan mode and the test results obtained while the chip circuit is operating in the delayed scan mode are expected).

If both test results are correct, proceed to process block 506 where both test results indicate that no defects are detected. If at least one of both test results is incorrect, proceed to process block 507 to determine whether both test results indicate a single bit failure. If both test results indicate a single bit failure, proceed to process block 509 where a defect bit in both test results is located by triangulating a failed bit of a failed unit. If at least one of both test result does not indicate a single bit failure, proceed to process block 508 where a failed unit of the chip circuit is detected by operating the chip circuit in an individual scan mode or performing a binary search.

Figure 8:
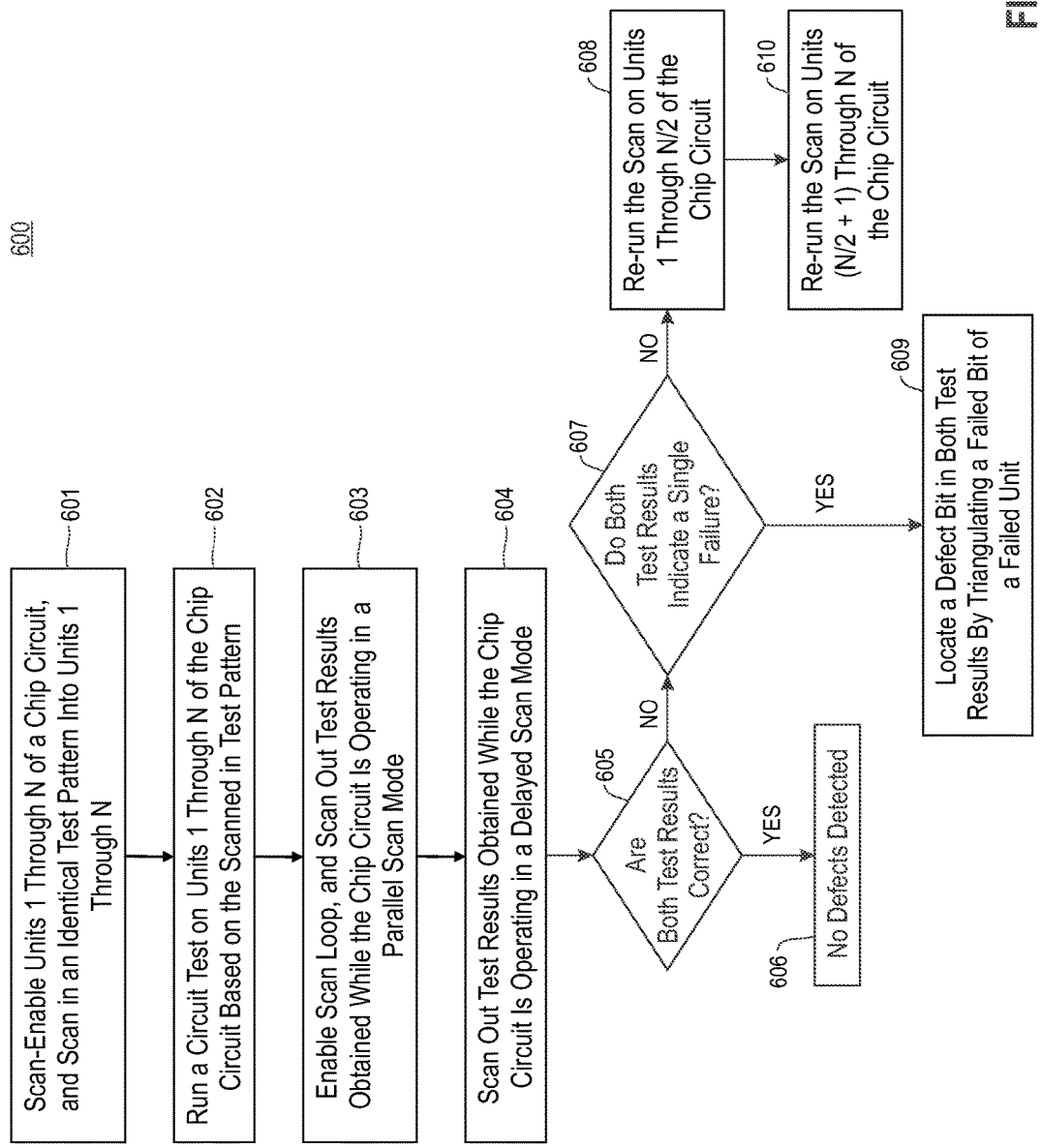
FIG. 8 illustrates a flowchart of an example process for triangulating a failed unit of a chip circuit by combining a binary search with a parallel scan mode and a delayed scan mode, in accordance with an embodiment of the invention.

FIG. 8 illustrates a flowchart of an example process 600 for locating a failed unit of a chip circuit by combining a binary search with a parallel scan mode and a delayed scan mode, in accordance with an embodiment of the invention. In process block 601, scan-enable units 1 through N of a chip circuit, and scan in an identical test pattern into units 1 through N. In process block 602, run a circuit test on units 1 through N of the chip circuit based on the scanned in test pattern. In process block 603, enable scan loop and scan out test results obtained while the chip circuit is operating in a parallel scan mode. In process block 604, scan out test results obtained while the chip circuit is operating in a delayed scan mode. In process block 605, determine whether both test results are correct (i.e., determine whether the test results obtained while the chip circuit is operating in the parallel scan mode and the test results obtained while the chip circuit is operating in the delayed scan mode are expected).

If both test results are correct, proceed to process block 606 where the test results indicate that no defects are detected. If at least one of both test results is incorrect, proceed to process block 607 to determine whether both test results indicate a single bit failure. If both test results indicate a single bit failure, proceed to process block 609 where a defect bit in both test results is located by triangulating a failed bit of a failed unit.

If at least one of both test results does not indicate a single bit failure, proceed to process blocks 608 and 610. In process block 608, the scan is re-run on units 1 through N/2 of the chip circuit. In process block 610, the scan is re-run on units (N/2+1) through N of the chip circuit.

Figure 9:
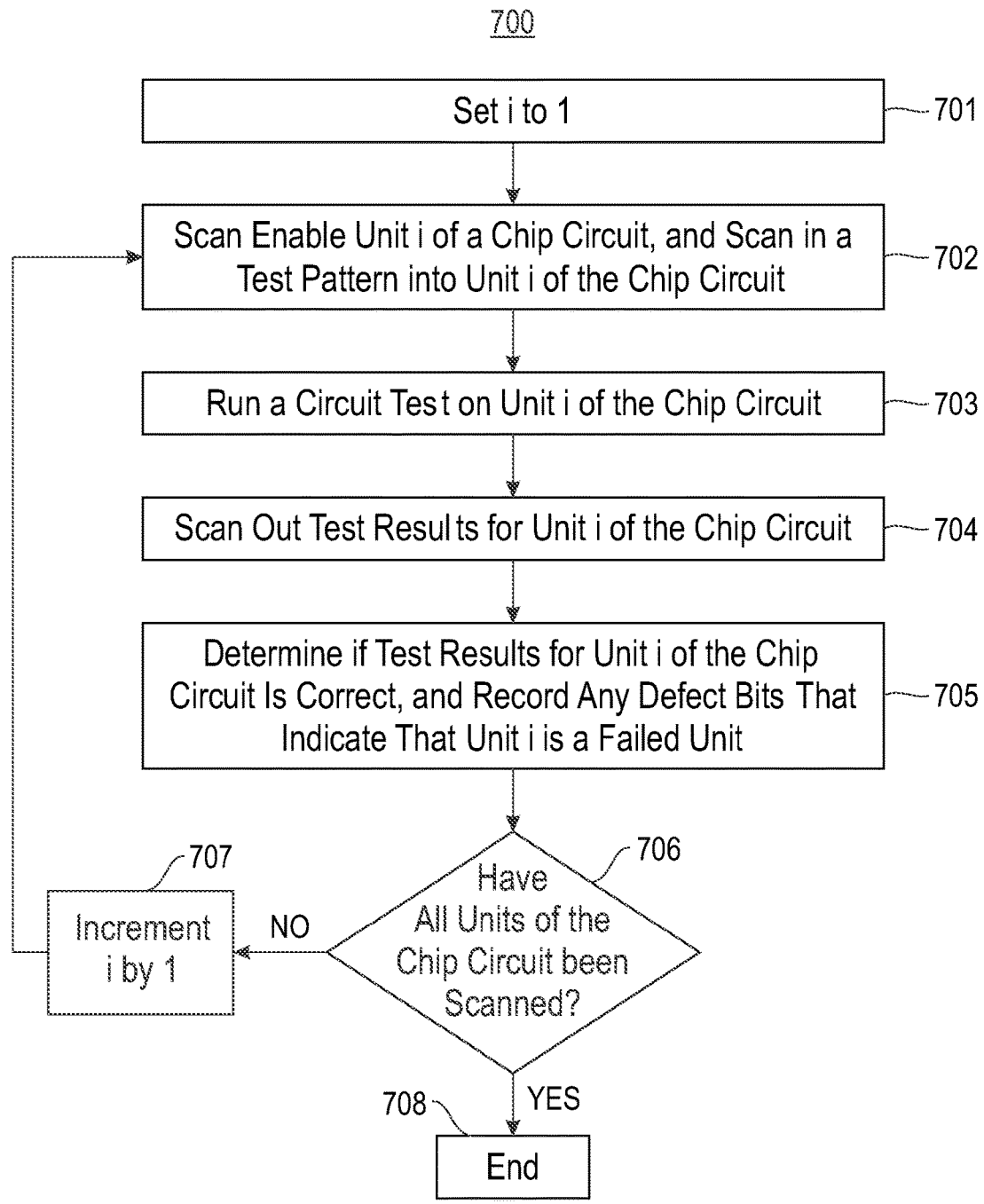
FIG. 9 illustrates a flowchart of an example process for scanning each unit of a chip circuit using an individual scan mode, in accordance with an embodiment of the invention.

FIG. 9 illustrates a flowchart of an example process 700 for scanning each unit of a chip circuit using an individual scan mode, in accordance with an embodiment of the invention. In process block 701, set i to 1. In process block 702, scan enable unit i of a chip circuit, and scan in a test pattern into unit i of the chip circuit. In process block 703, run a circuit test on unit i of the chip circuit. In process block 704, scan out test results for unit i of the chip circuit. In process block 705, determine if test results for unit i of the chip circuit is correct, and record any defect bits that indicated that unit i is a failed unit.

In process block 706, determine whether all units of the chip circuit have been scanned. If there are remaining units of the chip circuit to scan, proceed to process block 707 where i is incremented by 1. Process block 707 loops back to process block 702. If all units of the chip circuit have been scanned, proceed to process block 708 where the process 700 ends.

Figure 10:
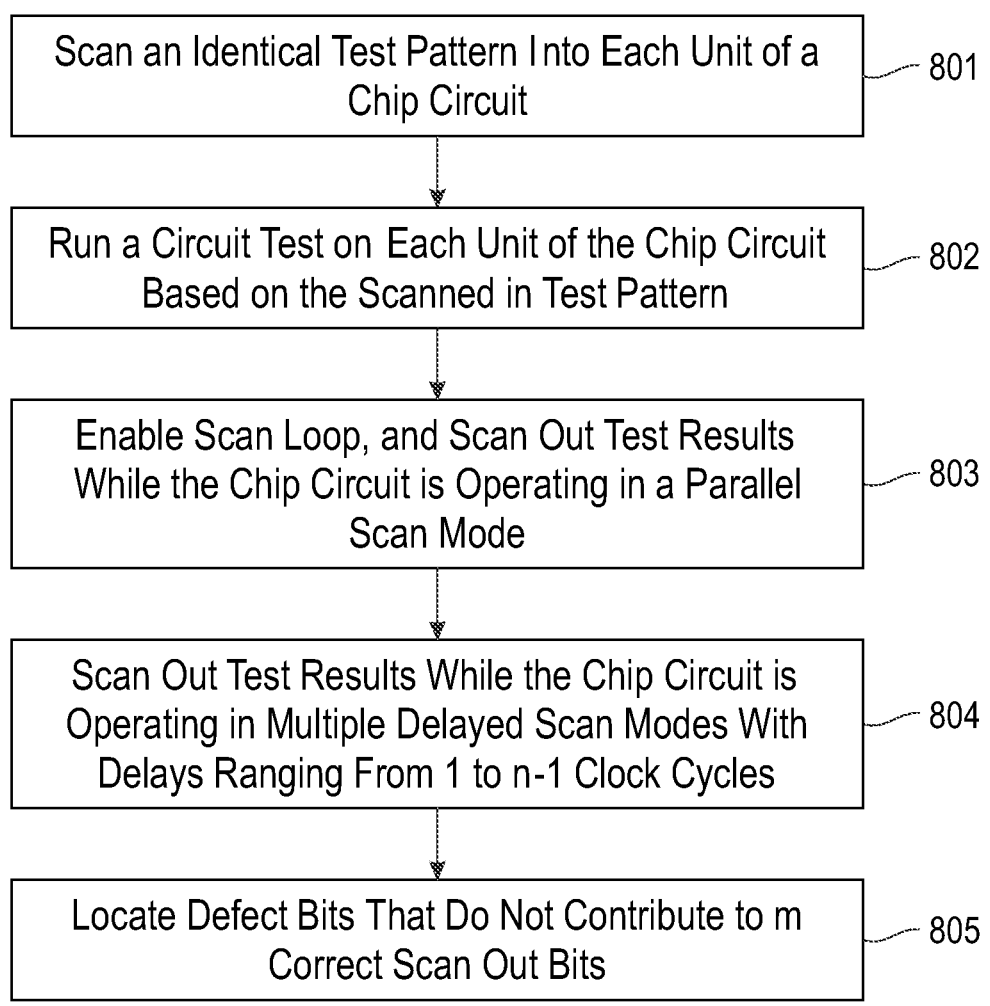
FIG. 10 illustrates a flowchart of an example process for triangulating one or more failed units of a chip circuit using a parallel scan mode and a multiple delayed scan mode with multiple delays, in accordance with an embodiment of the invention.

FIG. 10 illustrates a flowchart of an example process 800 for triangulating one or more failed units of a chip circuit using a parallel scan mode and a multiple delayed scan mode with multiple delays, in accordance with an embodiment of the invention. In process block 801, scan an identical test pattern into each unit of the chip circuit. In process block 802, run a circuit test on each unit of the chip circuit based on the scanned in test pattern. In process block 803, enable scan loop and scan out test results obtained while the chip circuit is operating in a parallel scan mode. In process block 804, scan out test results obtained while the chip circuit is operating in multiple delayed scan modes with delays ranging from 1 to n−1 clock cycles. In process block 805, locate defect bits that do not contribute to m correct scan out bits. For example, check if every bit in the test results contributes to the m correct scan out bits. Bits that contribute to more than or equal to m correct scan out bits are marked as correct, whereas bits that contribute of less than m correct scan out bits are marked as failed.

Figure 11:
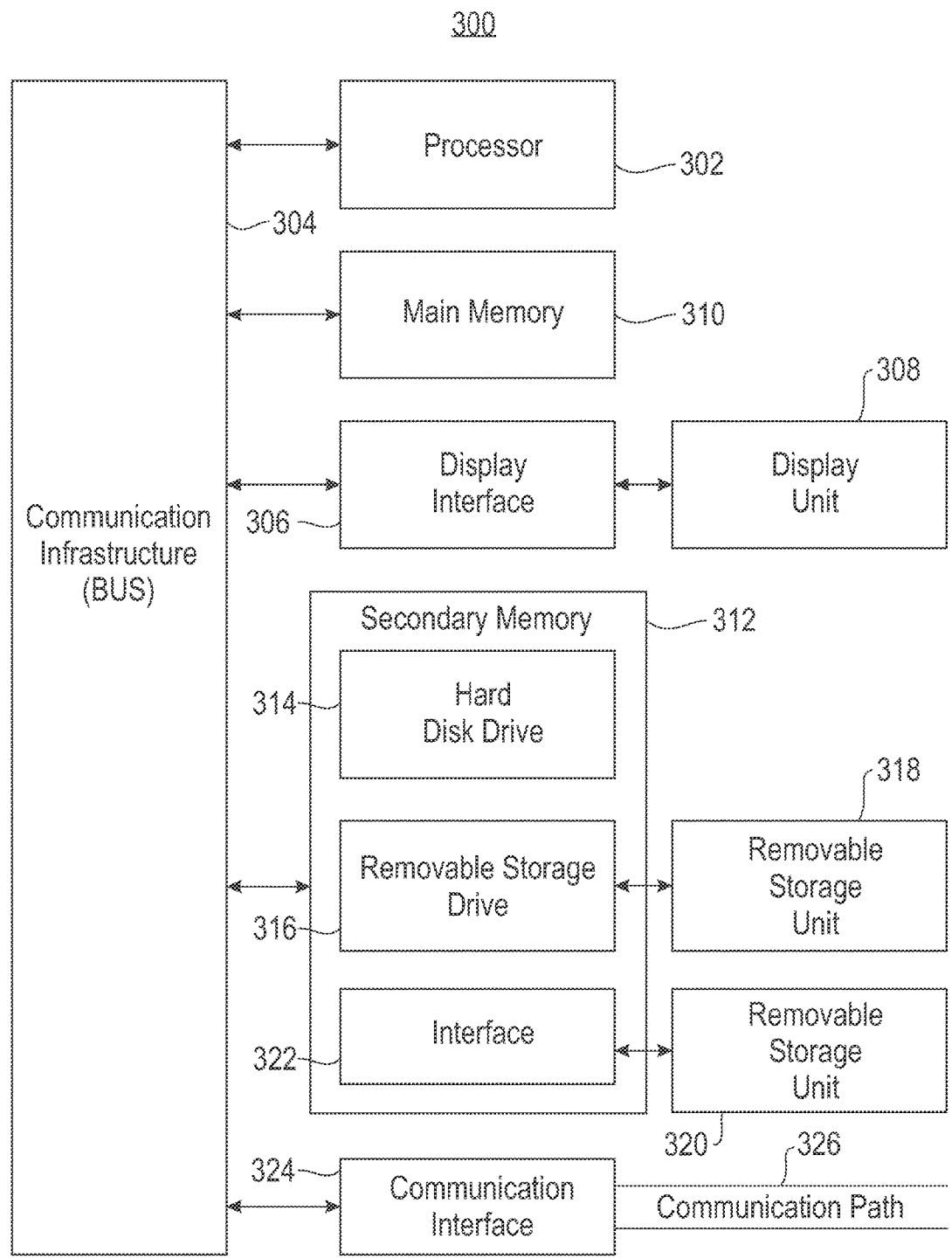
FIG. 11 is a high level block diagram showing an information processing system useful for implementing one embodiment of the present invention.

FIG. 11 is a high level block diagram showing an information processing system 300 useful for implementing one embodiment of the present invention. The computer system includes one or more processors, such as processor 302. The processor 302 is connected to a communication infrastructure 304 (e.g., a communications bus, cross-over bar, or network).

The computer system can include a display interface 306 that forwards graphics, text, and other data from the communication infrastructure 304 (or from a frame buffer not shown) for display on a display unit 308. The computer system also includes a main memory 310, preferably random access memory (RAM), and may also include a secondary memory 312. The secondary memory 312 may include, for example, a hard disk drive 314 and/or a removable storage drive 316, representing, for example, a floppy disk drive, a magnetic tape drive, or an optical disk drive. The removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc. which is read by and written to by removable storage drive 316. As will be appreciated, the removable storage unit 318 includes a computer readable medium having stored therein computer software and/or data.

In alternative embodiments, the secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM, or PROM) and associated socket, and other removable storage units 320 and interfaces 322 which allow software and data to be transferred from the removable storage unit 320 to the computer system.

The computer system may also include a communication interface 324. Communication interface 324 allows software and data to be transferred between the computer system and external devices. Examples of communication interface 324 may include a modem, a network interface (such as an Ethernet card), a communication port, or a PCMCIA slot and card, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

In this document, the terms "computer program medium," "computer usable medium," and "computer readable medium" are used to generally refer to media such as main memory 310 and secondary memory 312, removable storage drive 316, and a hard disk installed in hard disk drive 314.

Computer programs (also called computer control logic) are stored in main memory 310 and/or secondary memory 312. Computer programs may also be received via communication interface 324. Such computer programs, when run, enable the computer system to perform the features of the present invention as discussed herein. In particular, the computer programs, when run, enable the processor 302 to perform the features of the computer system. Accordingly, such computer programs represent controllers of the computer system.

From the above description, it can be seen that the present invention provides a system, computer program product, and method for implementing the embodiments of the invention. The present invention further provides a non-transitory computer-useable storage medium for initializing and testing integrated circuits using a scan system that has multiple operating modes, such as an individual scan mode, a parallel scan mode, and a delayed scan mode. The non-transitory computer-useable storage medium has a computer-readable program, wherein the program upon being processed on a computer causes the computer to implement the steps of the present invention according to the embodiments described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for triangulating multiple failed processing elements, the method comprising:
   simultaneously scanning multiple processing elements of a chip circuit in a parallel scan mode and a delayed scan mode; and
   triangulating one or more failed processing elements of the chip circuit by:
      comparing a first parity value representing a parity of a first set of scan outputs scanned out from all processing elements in the parallel scan mode against a first expected value; and
      comparing a second parity value representing a parity of a second set of scan outputs scanned out from all processing elements in the delayed scan mode against a second expected value;
   wherein, in the parallel scan mode, the multiple processing elements are scanned simultaneously and in parallel; and
   wherein, in the delayed scan mode, at least one processing element of the multiple processing elements is scanned after one or more clock delays has elapsed.

2. The method of claim 1, further comprising:
   providing a scan enable signal to at least one processing element; and
   providing a scan clock signal to at least one processing element;
   wherein a processing element scans in a scan input and scans out a scan output when said processing element receives both a scan clock signal and a scan enable signal that scan enables said processing element.

3. The method of claim 2, further comprising:
   comparing a scan output scanned out by a processing element against an expected scan output to determine whether said processing element is a failed processing element.

4. The method of claim 1, wherein each processing element is configured to perform at least one of arithmetical, logical and input/output (I/O) operations.

5. The method of claim 4, wherein each processing element is a neurosynaptic neural core circuit.

6. The method of claim 4, wherein each processing element is one of the following: a microprocessor, a microcontroller, a digital signal processor, a graphics processor, a reconfigurable processor, a fixed function unit, a hardware accelerator, or a logic gate.

7. A system comprising:
   at least one processor; and
   a non-transitory processor-readable memory device storing instructions that when executed by the at least one processor causes the at least one processor to perform operations including:
      simultaneously scanning multiple processing elements of a chip circuit in a parallel scan mode and a delayed scan mode; and
      triangulating one or more failed processing elements of the chip circuit by:
         comparing a first parity value representing a parity of a first set of scan outputs scanned out from all processing elements in the parallel scan mode against a first expected value; and
         comparing a second parity value representing a parity of a second set of scan outputs scanned out from all processing elements in the delayed scan mode against a second expected value;
      wherein, in the parallel scan mode, the multiple processing elements are scanned simultaneously and in parallel; and
      wherein, in the delayed scan mode, at least one processing element of the multiple processing elements is scanned after one or more clock delays has elapsed.

8. The system of claim 7, wherein the operations further comprise:
   providing a scan enable signal to at least one processing element; and
   providing a scan clock signal to at least one processing element;
   wherein a processing element scans in a scan input and scans out a scan output when said processing element receives both a scan clock signal and a scan enable signal that scan enables said processing element.

9. The system of claim 8, wherein the operations further comprise:
   comparing a scan output scanned out by a processing element against an expected scan output to determine whether said processing element is a failed processing element.

10. The system of claim 7, wherein each processing element is configured to perform at least one of arithmetical, logical and input/output (I/O) operations.

11. The system of claim 10, wherein each processing element is a neurosynaptic neural core circuit.

12. The system of claim 10, wherein each processing element is one of the following: a microprocessor, a microcontroller, a digital signal processor, a graphics processor, a reconfigurable processor, a fixed function unit, a hardware accelerator, or a logic gate.

13. A computer program product comprising a computer-readable hardware storage device having program code embodied therewith, the program code being executable by a computer to implement a method for simulating slowest and fastest neural dynamics of a neural model, the method comprising:
  simultaneously scanning multiple processing elements of a chip circuit in a parallel scan mode and a delayed scan mode; and
  triangulating one or more failed processing elements of the chip circuit by:
    comparing a first parity value representing a parity of a first set of scan outputs scanned out from all processing elements in the parallel scan mode against a first expected value; and
    comparing a second parity value representing a parity of a second set of scan outputs scanned out from all processing elements in the delayed scan mode against a second expected value;
  wherein, in the parallel scan mode, the multiple processing elements are scanned simultaneously and in parallel; and
  wherein, in the delayed scan mode, at least one processing element of the multiple processing elements is scanned after one or more clock delays has elapsed.

14. The computer program product of claim 13, further comprising:
  providing a scan enable signal to at least one processing element; and
  providing a scan clock signal to at least one processing element;
  wherein a processing element scans in a scan input and scans out a scan output when said processing element receives both a scan clock signal and a scan enable signal that scan enables said processing element.

15. The computer program product of claim 14, further comprising:
  comparing a scan output scanned out by a processing element against an expected scan output to determine whether said processing element is a failed processing element.

16. The computer program product of claim 13, wherein each processing element is configured to perform at least one of arithmetical, logical and input/output (I/O) operations.

17. The computer program product of claim 16, wherein each processing element is a neurosynaptic neural core circuit.

18. The computer program product of claim 16, wherein each processing element is one of the following: a microprocessor, a microcontroller, a digital signal processor, a graphics processor, a reconfigurable processor, a fixed function unit, a hardware accelerator, or a logic gate.

* * * * *